United States Patent [19]

Totoki et al.

[11] 4,449,060
[45] May 15, 1984

[54] PRESET CIRCUIT FOR A CLOCKED FLIP-FLOP

[75] Inventors: Takashi Totoki, Kawasaki; Susumu Kawakami, Yokohama, both of Japan

[73] Assignee: Tokyo Shibaura Denki Kabushiki Kaisha, Kawasaki, Japan

[21] Appl. No.: 360,971

[22] Filed: Mar. 23, 1982

[30] Foreign Application Priority Data

Apr. 13, 1981 [JP] Japan ................. 56-55452

[51] Int. Cl.³ .................. H03K 19/003; H03K 3/037; H03K 17/30
[52] U.S. Cl. ................. 307/247 R; 307/479; 307/443
[58] Field of Search .......... 307/247 R, 479; 377/107

[56] References Cited

U.S. PATENT DOCUMENTS

| | | | |
|---|---|---|---|
| 3,515,998 | 6/1970 | Adams et al. | 307/247 R |
| 3,603,816 | 9/1971 | Podraza | 307/247 R |
| 3,673,434 | 6/1972 | McIntosh | 307/247 R |
| 4,001,611 | 1/1977 | Maruyama et al. | 307/247 R |

OTHER PUBLICATIONS

C² MOS Integrated Circuits Technical Data, First Edition, Jan. 1981, Toshiba Corporation, Tokyo, Japan.

*Primary Examiner*—John S. Heyman
*Attorney, Agent, or Firm*—Finnegan, Henderson, Farabow, Garrett & Dunner

[57] ABSTRACT

A preset circuit for a flip-flop of set priority type having set and reset terminals both being intended for preset function and wherein data "1" is preset where both of terminals are enabled and only the set terminal is enabled, data "0" is preset where only the reset terminal is enabled, and usual operation is achieved where both of terminals are disabled causes both of set and reset terminals to be enabled where data "1" is to be preset. The preset circuit supplies data input to the set terminal through a NOR gate which uses the signal supplied to the reset terminal as a gate signal.

6 Claims, 8 Drawing Figures

PRESET CIRCUIT FOR A CLOCKED FLIP-FLOP

BACKGROUND OF THE INVENTION

The present invention relates to a preset circuit for a clocked flip-flop.

A preset function is usually added to a clocked flip-flop so as to an initial condition independently of the clock signal. This can be realized by providing the flip-flop with preset terminals for setting and resetting, which are independent of the clock signal, in addition to the set and reset terminals, which are synchronized with the clock signal. This type of flip-flop which can be preset is labeled as set priority type or reset priority type depending upon whether a "1" or a "0" preset state appears at the output thereof when both of its preset terminals are enabled.

FIG. 1 shows the conventional JK flip-flop and its preset circuit, the flip-flop being of set priority type and having a set terminal S and an inverted reset terminal $\overline{R}$ both being intended for preset function. The flip-flop 10 comprises NOR gates 12, 14, 16, and 18, AND gates 20, 22, and 24, clocked inverters 26, 28, 30, and 32 and an inverter 34. Inputs K and J are supplied to the NOR gare 12 and AND gate 20, respectively, and output Q is generated from the inverter 34. The set input S and inverted reset input $\overline{R}$ are supplied to the NOR gates 16, 18 and AND gates 22, 24, respectively. The preset circuit comprises a NOR gate 42, an AND gate 44 and an inverter 46. Clear and load inputs are supplied to the NOR gate 42, whose output is supplied, as the inverted reset signal $\overline{R}$, to the flip-flop 10. The clear input is supplied through the inverter 46 to the AND gate 44. A preset data input Din and the load input are also supplied to the AND gate 44, whose output is supplied, as the set signal S, to the flip-flop 10.

Prior to describing the preset operation of this flip-flop 10, the truth table of the flip-flop will be shown below as Table 1.

TABLE 1

| J | K | S | $\overline{R}$ | $Q_{n+1}$ | Mode |
|---|---|---|---|---|---|
| 0 | 0 | 0 | 1 | $Q_n$ | Normal |
| 0 | 1 | 0 | 1 | 0 | |
| 1 | 0 | 0 | 1 | 1 | |
| 1 | 1 | 0 | 1 | $\overline{Q_n}$ | |
| * | * | 0 | 0 | 0 | Reset |
| * | * | 1 | 0 | 1 | Set priority |
| * | * | 1 | 1 | 1 | Set |

Mark * in J, and K columns represents either 0 or 1.

$Q_{n+1}$ varies in synchronism with the clock signal when under normal mode, but varies independently of the clock signal when under other modes.

A preset circuit for presetting a flip-flop of set priority type can be made simpler if the set priority de is used to preset data "1", instead of the set mode. Namely, to preset the data, the clear input is set to logic 0 level at the time of usual operation, load input to logic 1 level, and data input Din to a logic level corresponding to the data to be preset. The output of the NOR gate 42, i.e., inverted reset input $\overline{R}$ thus becomes logic 0 level and the output Q of the flip-flop becomes the same level as that of the set input S. Since the output of the AND gate 44, i.e., set input S becomes the same level as that of the data input Din, the output $Q_{n+1}$ is preset with the data of the data input Din. The clear input is set logic 1 level at the time of system reset operation.

When preset is finished, the mode of the flip-flop is changed to the normal mode, but the following drawback is caused when the set priority mode is changed to the normal mode. The change from the set priority mode to the normal mode makes it necessary to change both of the set and inverted reset inputs S and $\overline{R}$, and this can be achieved by setting the load input to and logic 0 level. The AND gate 44 is thus rendered nonconductive while the NOR gate 42 conductive. As shown in FIG. 2, however, the reset mode is entered in the course of changing from the set priority mode to the normal mode so that the output Q becomes of logic 0 level is the timing at which reset input $\overline{R}$ rises is later than the timing at which the set input S falls. This is because the timing of the set and reset inputs after the load input is changed can not be precisely controlled due to the influence of the parasitic capacity and the like. In the case where data "0" is preset and the reset mode is changed to the normal mode, the drawback is not caused because the set input S is held unchanged, i.e., of logic 0 level.

The same drawback is also caused in the flip-flop of reset priority type. FIG. 3 shows the conventional preset circuit for a flip-flop of reset priority type. A set signal intended for preset function is supplied to an inverted set terminal $\overline{S}$ of a flip-flop 50. Clear and load inputs are supplied to a NOR gate 52, whose output is supplied to the inverted set terminal $\overline{S}$. An inverted data input $\overline{Din}$ and a load input are supplied to an AND gate 54. An output of the AND gate 54 and the clear input are supplied to an OR gate 56, whose output is supplied to a reset terminal R of the flip-flop 50. The truth table of the flip-flop of reset priority type will be shown below as Table 2.

TABLE 2

| J | K | $\overline{S}$ | R | $Q_{n+1}$ | Mode |
|---|---|---|---|---|---|
| 0 | 0 | 1 | 0 | $Q_n$ | Normal |
| 0 | 1 | 1 | 0 | 0 | |
| 1 | 0 | 1 | 0 | 1 | |
| 1 | 1 | 1 | 0 | $\overline{Q_n}$ | |
| * | * | 1 | 1 | 0 | Reset |
| * | * | 0 | 1 | 0 | Reset priority |
| * | * | 0 | 0 | 1 | Set |

Similarly to the above, the reset priority mode is employed instead of the reset mode to preset data "0" in the flip-flop of reset priority type. To preset the data, the clear input is set logic 0 level, load input logic 1 level, and inverted data input $\overline{Din}$ an inverted level of the data to be preset. The NOR gate 52 is thus rendered nonconductive, the inverted set input $\overline{S}$ becomes of logic 0 level, and the output Q of the flip-flop 50 of a level inverse to that of the reset input R. The output of the AND gate 54, i.e., reset input R of the flip-flop 50 becomes of the same level as that of the inverted data input $\overline{Din}$. Namely, the output Q of the flip-flop 50 becomes of a level corresponding to that of data to be preset.

The same drawback already described above is caused when the reset priority mode is changed to the normal mode. As shown in FIG. 4, the flip-flop is set to the set mode when the load input is set logic 0 level and the timing at which the inverted set input $\overline{S}$ rises is later than the timing at which the reset input R falls.

In an attempt to alleviate this drawback, the falling timing of the set input S in the case of the set priority type flip-flop and the falling timing of the reset input R in the case of the reset priority type flip-flop may be; and delayed by adding a load capacity and multistage gates to these inputs. However, this method makes the operation speed slower, which provides a problem particularly when flip-flops are multistage-connected to form a counter and the like. In addition, this method sometimes prevents reliable operation from being achieved because of difference in manufacturing conditions and wiring manners when it is integrated.

SUMMARY OF THE INVENTION

The object of the present invention is to provide a preset circuit simple in construction and capable of reliably setting the flip-flop to initial condition.

This object can be achieved by a preset circuit for a flip-flop having first and second preset terminals for presetting data values "0" and "1" respectively, and wherein one of these data valves is preset where both terminals are enabled and usual operation is achieved where both terminals are disabled, the preset circuit comprising a signal terminal connected to the first preset terminal and to which a signal for setting the flip-flop to a preset mode is supplied, a data terminal to which preset data is supplied, and a gate circuit connected between the data terminal and second preset terminal and controlled by the level of the signal terminal.

DETAILED DESCRIPTION OF THE PREFERRED EMBODIMENTS

Figure 1:
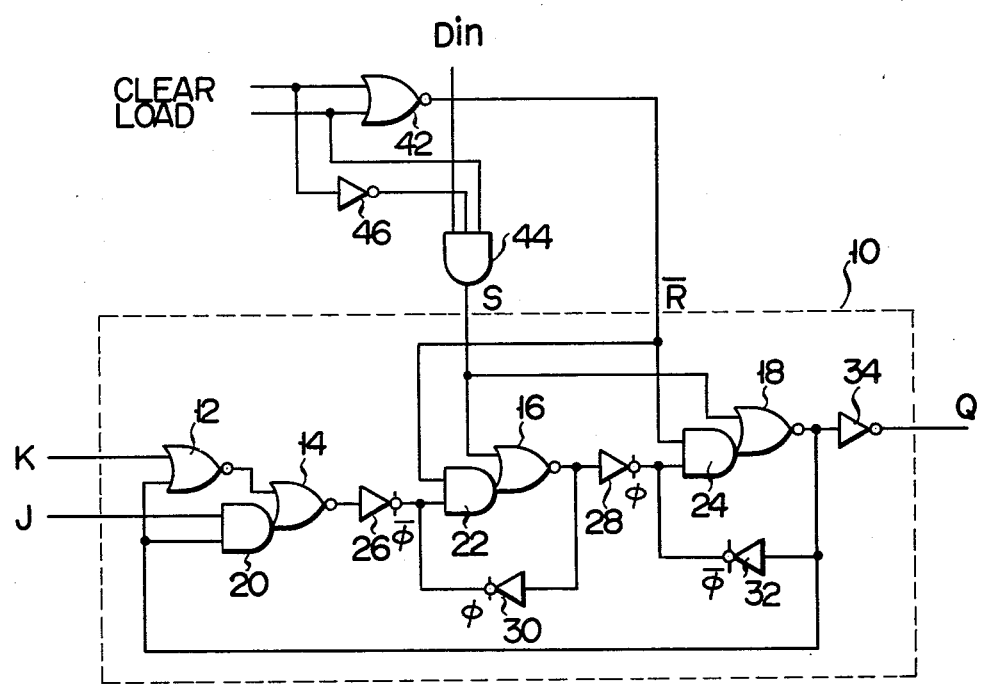
FIG. 1 is a circuit diagram showing a conventional preset circuit for a flip-flop of set priority type.
Figure 2:
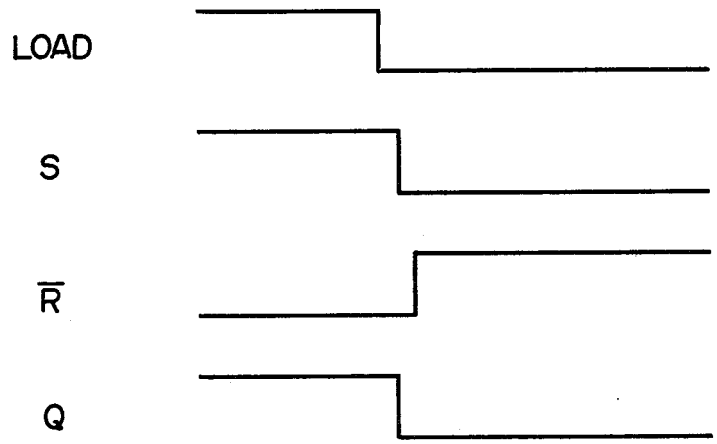
FIG. 2 is a time chart showing the operation of the preset circuit shown in FIG. 1.
Figure 3:
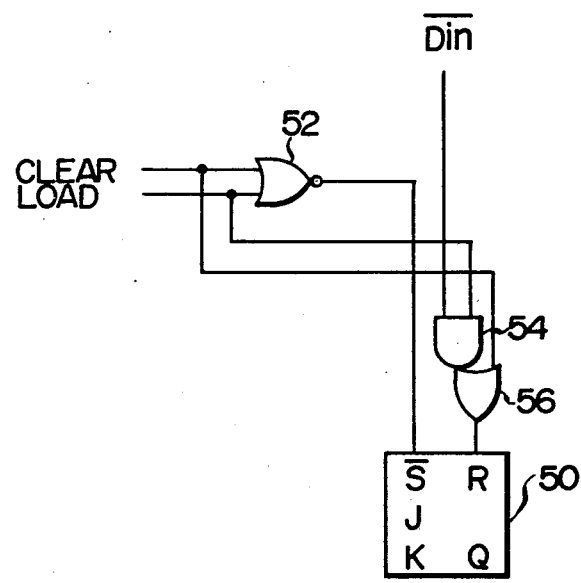
FIG. 3 is a circuit diagram showing a conventional preset circuit for a flip-flop of reset priority type.
Figure 4:
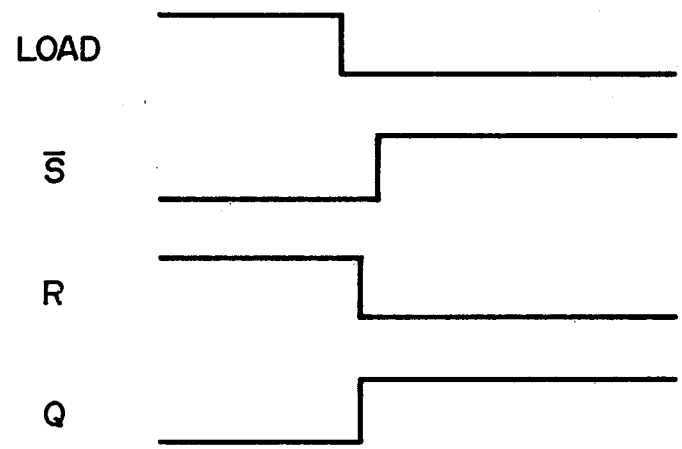
FIG. 4 is a time chart showing the operation of the preset circuit shown in FIG. 3.
Figure 5:
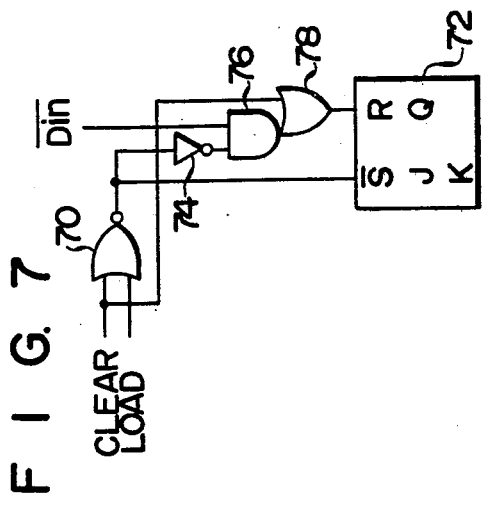
FIG. 5 is a circuit diagram showing an embodiment of a preset circuit according to the present invention and employed to in; and a flip-flop of set priority type.

An embodiment of a preset circuit according to the present invention will be described referring to the drawing. FIG. 5 shows an embodiment of a preset circuit for a flip-flop of set priority type. Clear and load inputs are supplied to a NOR gate 60, whose output terminal is connected to an inverted reset terminal $\bar{R}$ of a flip-flop 62. A clear input and the output of the NOR gate 60 are supplied to a NOR gate 64. A data input Din is supplied through an inverter 66 to the NOR gate 64, whose output terminal is connected to a set terminal S of the flip-flop 62.

Figure 6:
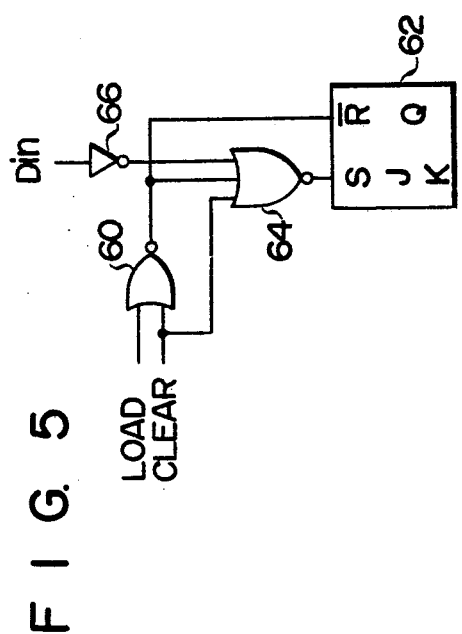
FIG. 6 is a time chart showing the operation of the preset circuit shown in FIG. 5.

It is assumed prior to describing the operation of this embodiment that the truth table of the flip-flop 62 is as shown in Table 1. Where data "1" is preset, the data input Din is set to logic 1 level, clear input to logic 0 level, and load input to logic 1 level. The inverted reset terminal $\bar{R}$ thus becomes of logic 0 level and the set terminal S of logic 1 level, so that the flip-flop 62 is set to the set priority mode so as to preset data "1". When the load input is set to; and logic 0 level, the output terminal of the NOR gate 60, i.e., the inverted reset terminal $\bar{R}$ becomes logic 1 level. Since the output of the NOR gate 60 is supplied to the NOR gate 64 which is connected to the front stage of the set terminal S, as shown in FIG. 6, the set terminal S can never change to logic 0 level before the inverted reset terminal $\bar{R}$ changes to of logic 1 level. Namely, the flip-flop 62 changes from the set priority mode to the set mode and then to the normal mode, thus enabling preset data "1" to be reliably held. As described above, this embodiment causes set signal to be supplied to the flip-flop through the NOR gate 64 which is controlled by the inverted reset signal. Therefore, there is no concern that the reset mode will be entered in the course of changing from the set priority mode to the normal mode. In addition, this embodiment makes it unnecessary to connect multistage gates and to add a load capacity to the set terminal, thus preventing the operation speed from being made slower and the operation itself from being made unreliable.

Where data "0" is preset, the data input Din is set logic 0 level. The flip-flop 62 is thus set to the reset mode and data "0" is preset. Where the load input is set logic 0 level, the inverted reset terminal $\bar{R}$ becomes of logic 1 level and the set terminal S is held unchanged, so that the flip-flop 62 is set to the normal mode. The preset of data "0" is the same as in the conventional case and causes no problem.

Figure 7:
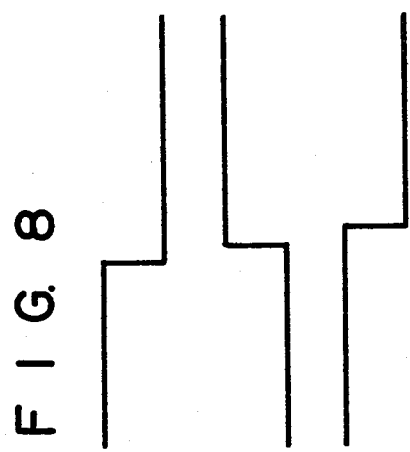
FIG. 7 is a circuit diagram showing another embodiment of a preset circuit according to the present invention and employed in a flip-flop of reset priority type.

Another embodiment of a preset circuit according in the present invention and employed to a flip-flop of reset priority type will be described referring to FIG. 7. Clear and load inputs are supplied to a NOR gate 70, whose output terminal is connected to an inverted set terminal $\bar{S}$ of a flip-flop 72 of reset priority type and to the input terminal of an inverter 74. An inverted data input $\overline{Din}$ and the output of the inverter 74 are supplied to an AND gate 76. The clear input and the output of the AND gate 76 are supplied via an OR gate 78 to a reset terminal R of the flip-flop 72.

Figure 8:
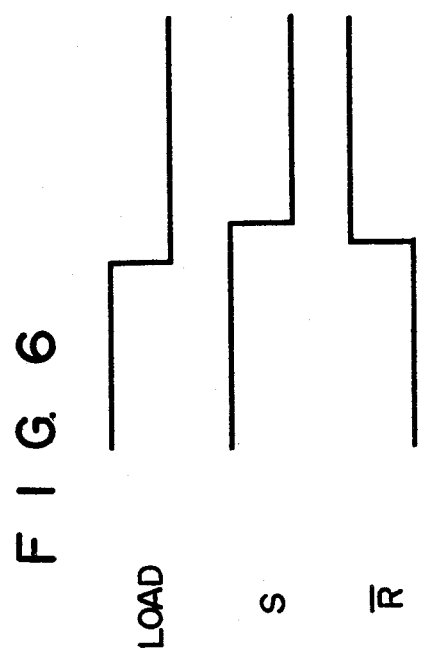
FIG. 8 is a time chart showing the operation of the preset circuit shown in FIG. 7.

It is assumed prior to describing the operation of the second embodiment that the truth table of the flip-flop 72 is as shown in Table 2. Where data "0" is preset, the inverted data input $\overline{Din}$ is set logic 1 level, clear input logic 0 level, and load input logic 1 level. The inverted set terminal $\bar{S}$ thus becomes logic 0 level and the reset terminal R becomes; and logic 1 level, so that the flip-flop 72 is set to the reset priority mode and data "0" is preset. Where the load input is then set logic 0 level, the output terminal of the NOR gate 70, i.e., the inverted set terminal $\bar{S}$ becomes of logic 1 level. Since the output of the NOR gate 70 is supplied to the AND gate 76 which is connected to the front stage of the reset terminal R, the reset terminal R can never change to logic 0 level before the inverted set terminal $\bar{S}$ changes to of logic 1 level, as shown in FIG. 8. Namely, the flip-flop 72 changes from the reset priority mode to the reset mode and then to the normal mode, thus enabling preset data "0" to be reliably held. As described above, the second embodiment can eliminate concern that the set mode is entered in the course of changing from the reset priority mode to the normal mode because the reset signal is supplied to the flip-flop via the AND gate 76 which is controlled by the inverted set signal. In addition, the second embodiment similar to the first embodiment neither makes the operation speed slower nor results in unreliability. The preset of data "1" is achieved in the same way as in the conventional case and causes no problem.

As described above, the present invention allows data to be reliably held without slowing the operation speed in the case where the flip-flop having first and second preset terminals for presetting data "0" and "1" is preset with data when both of terminals are enabled and these terminals are then returned to the disabled mode. It should be understood that the present invention is not limited to the embodiments described above. The gate which selectively passes one of preset signals using the other of preset signals may be variously modified. Further, the flip-flop is not limited to those of JK type but may be of D type, T type or the like.

What we claim is:

1. A preset circuit for a flip-flop having first and second preset terminals adapted to preset data "0" and "1", respectively, and having their priority levels different from each other, in which either of data "0" and "1" is preset by the preset terminal of the higher priority level during a preset mode when both of said first and second preset terminals are enabled; and a normal mode operation is performed when both of said first and second preset terminals are disabled, said preset circuit comprising:

a signal terminal directly connected to the preset terminal of the lower priority level and supplied with a signal for setting the flip-flop to the preset mode;

a data terminal to which the preset data is supplied; and gate means connected between said data terminal and the preset terminal of the higher priority level and also to said signal terminal so as to be controlled by the level of said signal thereat to thus assure phase lag of said preset mode setting signal to said preset terminal of the higher priority level.

2. A preset circuit for a flip-flop according to claim 1, wherein said flip-flop is preset with data "1" when said first and second preset terminals are enabled, and said signal terminal is connected to said second preset terminal while said gate means to said first preset terminal.

3. A preset circuit for a flip-flop according to claim 2, wherein said signal terminal is set to logic 1 level at the time of preset but is set to logic 0 level at all other times and connected together with a terminal set logic 0 level at the time of usual operation of the inverted terminal of said second preset terminal through a first NOR gate, and said gate means comprises a second NOR gate to the input of which are connected the output terminal of said first NOR gate, terminal of logic 0 level and the inverted terminal of said data terminal, and whose output terminal is connected to said first preset terminal.

4. A preset circuit for a flip-flop according to claim 1, wherein said flip-flop is preset with data "0" when both of said first and second preset terminals are enabled, and said signal terminal is connected to said first preset terminal and said gate means are connected to said second preset terminal.

5. A preset circuit for a flip-flop according to claim 4, wherein said signal terminal is made of logic 1 level at the time of preset mode but of logic 0 level at all other times and is connected together with a terminal set at logic 0 level at the time of usual operation to the inverted terminal of said first preset terminal through a NOR gate, and said gate means comprises an inverter connected to the output terminal of said NOR gate, an AND gate to which are connected the output terminal of said inverter and inverted terminal of said data terminal, and an OR gate to which are connected the output terminal of said AND gate and the terminal of logic 0 level and whose output terminal is connected to said second preset terminal.

6. A preset circuit for a flip-flop having first and second preset terminals adapted to preset data "0" and "1", respectively, and having their priority levels different from each other, in which either of data "0" and "1" is preset by the preset terminal of the higher priority level during a preset mode and a normal mode operation is performed when both of said first and second preset terminals are disabled, said preset circuit comprising:

a load signal terminal to which a load signal for setting the flip-flop to the preset mode is supplied;

first gate means connected between the load signal terminal and a lower priority level preset terminal to supply the load signal to the lower priority level preset terminal;

a data terminal to which the preset data is supplied; and second gate means having an output terminal connected to a higher priority level preset terminal and an input terminal connected to the output terminal of the first gate means and the data terminal, for controlling a supply of the load signal to the higher priority level preset terminal by the preset data of the data terminal.

* * * * *